United States Patent [19]

Wong

[11] Patent Number: 5,432,479
[45] Date of Patent: Jul. 11, 1995

[54] D.C. CURRENT COMPENSATION CIRCUIT FOR A NONLINEAR AMPLIFIER

[75] Inventor: Stephen Wong, Scarsdale, N.Y.

[73] Assignee: U.S. Philips Corporation, New York, N.Y.

[21] Appl. No.: 221,122

[22] Filed: Mar. 31, 1994

[51] Int. Cl.$^6$ .............................................. H03F 1/30
[52] U.S. Cl. ...................................... 330/296; 327/362
[58] Field of Search ................. 307/296.1, 296.6, 491; 330/110, 288, 289, 296

[56] References Cited

U.S. PATENT DOCUMENTS

| | | | |
|---|---|---|---|
| 3,935,478 | 1/1976 | Okada et al. | 330/296 X |
| 3,999,139 | 12/1976 | Fennell | 330/296 X |
| 5,150,076 | 9/1992 | Asazawa | 330/296 |

FOREIGN PATENT DOCUMENTS 0488443  6/1992  European Pat. Off.

*Primary Examiner*—Steven Mottola
*Attorney, Agent, or Firm*—Steven R. Biren

[57] ABSTRACT

A D.C. current compensation circuit for a nonlinear amplifier includes a compensating amplifier of substantially the same circuit configuration as that of the nonlinear amplifier, and a current mirror for coupling the compensation amplifier to the nonlinear amplifier to be compensated. The compensating amplifier is provided with feedback from its output to its input, so that a D.C. current provided to the output of the compensating amplifier can be used to compensate the D.C. input current of the nonlinear amplifier. In this manner, the nonlinear amplifier can be compensated for changes in gain due to temperature or manufacturing process variations.

6 Claims, 1 Drawing Sheet

5,432,479

D.C. CURRENT COMPENSATION CIRCUIT FOR A NONLINEAR AMPLIFIER

BACKGROUND OF THE INVENTION

This invention is in the field of nonlinear amplifiers, and relates more particularly to D.C. current compensation circuits for such nonlinear amplifiers.

Typically, nonlinear amplifiers, such as common-emitter gain stages used in RF or microwave amplifiers, have a nonlinear relationship between D.C. input current and D.C. output current, thus making it difficult to predict what the D.C. output current will be for a given D.C. input current. Furthermore, additional nonlinearities are created by process variations and temperature variations. The inability to precisely predict D.C. output current in conventional nonlinear gain stages is a problem because the D.C. output bias current of the nonlinear amplifier directly influences such parameters as voltage swing, transconductance, and, most importantly, voltage gain. Thus, if the relationship between D.C. input and D.C. output current (e.g. base current and collector current) is highly nonlinear, or highly variable due to temperature and/or process tolerances, then biasing a nonlinear amplifier stage such as a common-emitter stage using a conventional, fixed bias source will result in highly variable and unpredictable performance.

Various prior-art circuits for biasing and temperature compensating nonlinear amplifier stages are known, as shown, for example, in European Patent No. 0 488 443 and U.S. Pat. No. 5,150,076. However, the solutions presented in those references do not provide a simple and effective solution the problems discussed above.

Accordingly, it would be desirable to have a D.C. current compensation circuit for a nonlinear amplifier which is capable of controlling output bias current in a predictable manner, and which is capable of easily setting the output bias current to a desired value to achieve a particular gain and/or compensate for temperature or process variations.

SUMMARY OF THE INVENTION

It is thus an object of the invention to provide a D.C. current compensation circuit for a nonlinear amplifier which is capable of easily setting the output bias current to a desired value to achieve a particular gain and/or compensate for temperature or process variations.

In accordance with the invention, these objects are achieved by a new D.C. current compensation circuit for a nonlinear amplifier which includes a compensating amplifier of substantially the same circuit configuration as that of the nonlinear amplifier, and a current mirror for coupling the compensation amplifier to the nonlinear amplifier to be compensated. The compensating amplifier is provided with feedback from its output to its input, so that a D.C. current provided to the output of the compensating amplifier can be used to compensate the D.C. input current of the nonlinear amplifier. In this manner, the nonlinear amplifier can be compensated for changes in gain due to temperature or manufacturing process variations.

In a preferred embodiment of the invention, feedback is provided by a transistor having its input coupled to the output of the compensating amplifier stage and its main current path coupled between the input of the current mirror and the input of the compensating amplifier.

In a further preferred embodiment of the invention, a current supply for setting the D.C. output current of the compensating amplifier includes a transistor having a control terminal coupled to an input voltage through a resistor, with the main current path of the transistor being coupled between a power supply terminal and the output of the compensating amplifier.

According to yet a further preferred embodiment of the invention, the current supply for setting the D.C. output current of the compensating amplifier is a second current mirror having an input coupled to an input current source and an output coupled to the output of the compensating amplifier.

The basic operating principle of the invention is that a compensating amplifier of substantially the same circuit configuration as that of the nonlinear amplifier is provided in order to cancel out the nonlinearities of the nonlinear amplifier, thus making the D.C. output current of the nonlinear amplifier a linear function of the D.C. output current of the compensating amplifier. This is accomplished by providing the compensating amplifier in a feedback circuit which couples the output of the compensating amplifier back to its input, thus setting the input current of the compensating amplifier as a nonlinear function of its output, and then coupling this input current, through a current mirror, to the input of the nonlinear amplifier to be compensated. Since the compensating amplifier and the nonlinear amplifier are of substantially the same circuit configuration, their nonlinearities will cancel out, thus resulting in a D.C. output current from the nonlinear amplifier which is a controllable and linear function of the D.C. output current of the compensating amplifier, which latter current can be directly set to a desired value.

BRIEF DESCRIPTION OF THE DRAWING

The invention may be more completely understood with reference to the following detailed description, to be read in conjunction with the accompanying drawing, in which.

In the drawing, corresponding components in the various figures are generally designed with the same reference numerals.

DESCRIPTION OF THE PREFERRED EMBODIMENTS

Figure 1:
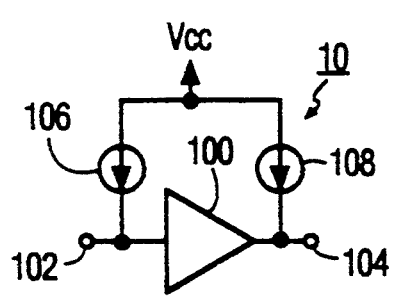
FIG. 1 shows a block diagram of a prior-art nonlinear amplifier stage.
Figure 2:
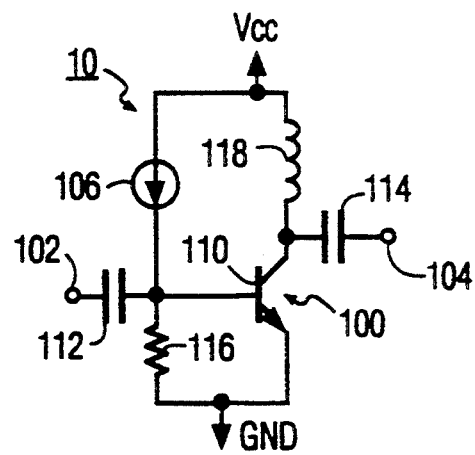
FIG. 2 shows a schematic diagram of a typical prior-art nonlinear amplifier circuit for use in RF or microwave amplifiers.

A prior-art nonlinear amplifier stage of the type typically used in RF or microwave amplifiers is shown in block diagram form in FIG. 1 and in schematic form in FIG. 2. In FIG. 1, a nonlinear amplifier stage 10 is composed of a nonlinear amplifier 100 having an input terminal 102 and an output terminal 104. The amplifier 100 is coupled to a power supply terminal Vcc by a D.C. input current source 106 at the input of amplifier and a D.C. output current source 108 at the amplifier output. It will be understood that the nonlinear amplifier stage 10 is deliberately shown in very general form, that the current sources 106 and 108 may be composed of various passive and/or active components, and that the amplifier 100 may be composed of one or more active devices in combination with various passive components. The essential point to note is that the amplifier 100 in FIG. 1 is a nonlinear amplifier, in which the D.C. output (or bias) current is not a linear function of the D.C. input (or bias) current, and which the gain of the amplifier stage 10 may vary with the magnitude of the D.C. output current as well as temperature and process variations. Since the D.C. output current of the amplifier stage will directly influence such parameters as voltage swing, transconductance, and voltage gain, the inability to precisely predict the magnitude of this current will result in highly variable and unpredictable performance.

The simple, single-transistor, common-emitter amplifier stage 10 shown in FIG. 2 is a typical prior-art nonlinear amplifier circuit used in RF or microwave applications. In the circuit of FIG. 2, the amplifier 100 includes transistor 110 connected in a common-emitter configuration, with the input terminal 102 being capacitively coupled to the base of the transistor by a capacitor 112, the output terminal 104 being coupled to the collector of transistor 110 by a capacitor 114, and the emitter of transistor 110 being grounded. D.C. input current is provided by current source 106, connected between Vcc and the base of transistor 110, and a resistor 116 is connected between the base of transistor 110 and ground. The circuit shown in FIG. 2 is completed by an inductor 118, connected between Vcc and the collector of transistor 110, which serves as both an operating-frequency load and a source of D.C. output or bias current analogous to the current source 108 shown in FIG. 1. Again it should be understood that this circuit is just one example of a simple nonlinear amplifier stage that might be typically used in RF or microwave amplifier applications, and in which a nonlinear and unpredictable relationship between D.C. output current and D.C. input current may result in highly variable and unpredictable performance.

Figure 3:
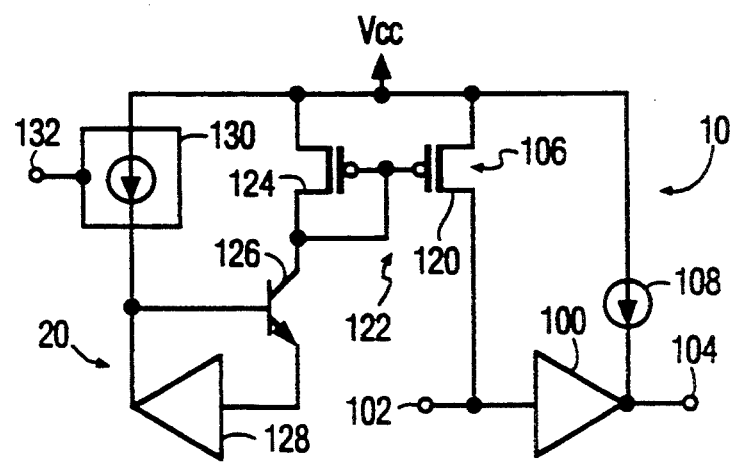
FIG. 3 shows a D.C. current compensation circuit for a nonlinear amplifier in accordance with the invention.

A D.C. current compensation circuit 20 for a nonlinear amplifier stage 10 in accordance with the present invention is shown in FIG. 3. In this circuit, nonlinear amplifier stage 10 is shown in block diagram form as in FIG. 1, but with D.C. input current source 106 being shown as a transistor (here a MOSFET) 120 which is connected as the output transistor of a current mirror 122 which also includes a transistor 124 which is connected as the input transistor of the current mirror. In the circuit of FIG. 3, the current mirror 122 operates off the high, or Vcc, side of the circuit, and the main current path of the input transistor 124 is connected in series with the main current path of a feedback transistor 126, shown here as a bipolar transistor. In this configuration, the collector of transistor 126 is coupled to the input of the current mirror, with the base of transistor 126 being coupled to the output terminal of a compensating amplifier 128, and the emitter of transistor 126 being coupled to the input of compensating amplifier 128, to create a feedback arrangement whereby a portion of the output current of amplifier 128 is coupled back to its input. The circuit of FIG. 3 is completed by a current supply 130 having a main current path between Vcc and a junction at the output of compensating amplifier 128 and the base of transistor 126. The current supply 130 has a control input 132 for receiving a signal to set the current level of the current supply 130, and thereby control the D.C. output current of the nonlinear amplifier 100 in a manner that will be explained in further detail below.

Figure 4:
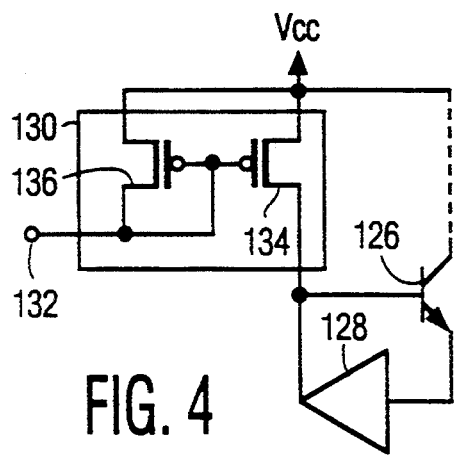
FIG. 4 shows a first embodiment of a current supply circuit for the compensation circuit.
Figure 5:
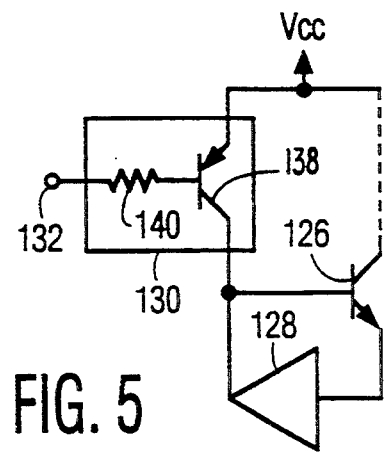
FIG. 5 shows a second embodiment of a current supply circuit for the compensation circuit.

FIGS. 4 and 5 show two alternate embodiments for the current supply 130 of the compensation circuit 20. In these figures, only the portion of the circuit at and to the left of transistor 126 in FIG. 3 is shown, for simplicity, with the portion of the circuit to the right of transistor 126 being as shown in FIG. 3. In FIG. 4, the current supply 130 includes transistors 134 and 136, connected in a conventional current-mirror configuration operating off the high side, as shown and described in connection with current mirror 122 in FIG. 3. In this circuit, an input bias current is provided to control input 132 during circuit operation, thereby controlling the D.C. output current of compensating amplifier 128. In the alternative embodiment shown in FIG. 5, the current supply 130 comprises a transistor 138 having its main current path connected between Vcc and the output of compensating amplifier 128, with a resistor 140 being connected between control input 132 and the control input of the transistor 138. In this case, a voltage input is applied to the control input 132 to generate the desired current in the current supply 130 to be applied to the output of compensating amplifier 128.

As noted above, prior-art nonlinear amplifiers such as those shown generally in FIG. 1 and more specifically in FIG. 2 have a D.C. output current which is a nonlinear and not easily predictable function of the D.C. input current, thus resulting in highly variable and unpredictable performance. In order to overcome these disadvantages, in accordance with the invention a nonlinear amplifier stage 10 is provided with a D.C. current compensation circuit 20 as shown in FIG. 3. In operation, the D.C. input current of nonlinear amplifier 100 is provided by transistor 120, which is connected in a current mirror configuration 122 with transistor 124. Thus, the D.C. input current to nonlinear amplifier 100 can be set to be either equal to the current flowing in the input transistor 124 of the current mirror (a scaling factor of 1) or else equal to a multiple k of the current flowing in transistor 124 (a scaling factor of k). The input current to the current mirror flows through feedback transistor 126 to the input of compensating amplifier 128, with the output current of amplifier 128 being provided by current supply 130, which is set by a signal at control input 132. Due to the feedback arrangement of this portion of the circuit, by setting the output current of amplifier 128 through the current supply 130, the current to the input of current mirror 122, and thus its output, can be controlled. Since the output of current mirror 122 provides the D.C. input current to nonlinear amplifier 100, it can be seen that this D.C. input current can be controlled by a signal applied at the control input 132 of the current supply 130.

Since the compensating amplifier 128 is provided with substantially the same circuit configuration as that of the nonlinear amplifier 100, these two amplifiers will exhibit substantially the same nonlinearities. Accordingly, when a selected current is provided by the current supply 130 into the output of amplifier 128, this current is reflected back into the input of amplifier 128 with a gain function which is substantially the inverse of that obtained from the input to the output of nonlinear amplifier 100, thus substantially cancelling out these nonlinearities and making the D.C. output current in nonlinear amplifier 100 a substantially linear function of the current generated by current supply 130.

In circuits designed to handle relatively low current levels, compensating amplifier 128 can be a duplicate of nonlinear amplifier 100, in which case the current mirror 122 will have a substantially unity gain. Alternatively, if the current in the nonlinear amplifier is substantial, reduced power consumption may be achieved by configuring compensating amplifier 128 to carry a current which is reduced by a scaling factor k from the current in nonlinear amplifier 100, in which case current mirror 122 will have a gain substantially equal to the scaling factor k. In this regard, it will be understood that amplifiers 100 and 128 will always have substantially the same circuit configuration, but can be designed to carry different current levels by appropriately selecting emitter areas (for bipolar transistor amplifiers) or aspect ratios (for MOS transistors). The scaling factor will then be equal to the emitter area ratio or aspect ratio, depending upon the type of transistors used.

In the circuit of FIG. 4, the current supply 130 is provided as a current mirror circuit, in which case the circuit is controlled by an input current provided to the control input 132. If it is desired to control the circuit with a voltage input at control input 132, a circuit such as that shown in FIG. 5 can be used. In FIG. 5, a resistor 140 is provided to convert the voltage at control input 132 into a current for driving the base of transistor 138 to generate a current to be provided to the output of compensating amplifier 128 at the collector of transistor 138.

The D.C. current compensation circuit of FIG. 3 offers several advantages over prior-art circuits. By using compensating amplifier 128, nonlinearities in amplifier 100 are effectively cancelled out, thus making the D.C. output current of the nonlinear amplifier a linear, and thus predictable, function of the current generated in current supply 130. In this manner, the D.C. output current of nonlinear amplifier 128 can be set in a predictable manner to achieve a desired voltage gain, voltage swing or transconductance. Furthermore, variations in D.C. output current due to temperature or process tolerance variations can now be easily compensated for by applying an appropriate signal to the control input 132 of the current supply 130. Additionally, it should be noted that in the circuit configuration shown in FIG. 5, temperature compensation can be achieved without additional complexity by appropriately selecting the temperature coefficient of resistor 140, thus providing an automatic temperature compensation feature without adding additional components.

While the invention has been particularly shown and described with reference to several preferred embodiments thereof, it will be understood by those skilled in the art that various changes in form and detail may be made without departing from the spirit and scope of the invention. Thus, for example, amplifiers 100 and 128 may be either simple, single-stage amplifiers or more complex multi-stage amplifiers, and transistors shown as bipolar transistors may be provided as MOS transistors and vice versa.

What is claimed is:

1. A D.C. current compensation circuit for a nonlinear amplifier, said nonlinear amplifier having a D.C. input current and a D.C. output current, the gain of said nonlinear amplifier being a function of said D.C. output current, said compensation circuit comprising a first current mirror having an input and an output coupled to an input of said nonlinear amplifier to control said D.C. input current, a compensating amplifier of substantially the same circuit configuration as that of said nonlinear amplifier and having a D.C. input current and a D.C. output current, the input of said first current mirror being coupled to the input of said compensating amplifier, feedback means for coupling the output of said compensating amplifier back to the input of said compensating amplifier and for controlling the D.C. input current of said compensating amplifier and an input current of said first current mirror, and current supply means for setting the D.C. output current of said compensating amplifier to compensate, through said first current mirror, the D.C. input current of said nonlinear amplifier.

2. A D.C. current compensation circuit for a nonlinear amplifier as in claim 1, wherein said feedback means comprises a first transistor having a control terminal and a main current path, said control terminal being coupled to the output of said compensating amplifier stage and said main current path being coupled between the input of said first current mirror and the input of said compensating amplifier.

3. A D.C. current compensation circuit for a nonlinear amplifier as in claim 1, wherein said compensating amplifier is a duplicate of said nonlinear amplifier and said first current mirror has substantially unity gain.

4. A D.C. current compensation circuit for a nonlinear amplifier as in claim 1, wherein said compensating amplifier is configured to carry a current which is reduced by a scaling factor from a current in said nonlinear amplifier, and said first current mirror has a gain substantially equal to said scaling factor.

5. A D.C. current compensation circuit for a nonlinear amplifier as in claim 1, wherein said current supply means for setting the D.C. output current of said compensating amplifier comprises a second current mirror having an input coupled to an input current source and an output coupled to the output of said compensating amplifier.

6. A D.C. current compensation circuit for a nonlinear amplifier as in claim 1, wherein said current supply means for setting the D.C. output current of said compensating amplifier comprises a second transmission having a control terminal and a main current path, said control terminal being coupled to an input voltage through a resistor and said main current path being coupled between a power supply terminal and the output of said compensating amplifier.

* * * * *